US008901938B2

(12) United States Patent
Willey et al.

(10) Patent No.: US 8,901,938 B2
(45) Date of Patent: Dec. 2, 2014

(54) DELAY LINE SCHEME WITH NO EXIT TREE

(75) Inventors: Aaron Willey, Burlington, VT (US); Yantao Ma, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 378 days.

(21) Appl. No.: 13/363,378

(22) Filed: Feb. 1, 2012

(65) Prior Publication Data

US 2013/0193986 A1  Aug. 1, 2013

(51) Int. Cl.
*G01R 27/28* (2006.01)

(52) U.S. Cl.
USPC ............ 324/617; 327/307; 327/362; 327/62

(58) Field of Classification Search
CPC ............ G06F 2212/72; G06F 2212/68; G06F 2213/00; G11C 5/00; G11C 2013/00; G11C 2207/00; G11C 2211/00; G11C 2213/00; G11C 2216/00; H01L 21/00; H01L 2021/00; H01L 2221/00; H01L 2223/00; H01L 2924/00; H01L 2925/00
USPC ........................................................ 324/617
See application file for complete search history.

(56) References Cited

U.S. PATENT DOCUMENTS

| 3,795,771 | A  | * | 3/1974 | Gundersen et al. | 370/242 |
| 7,113,048 | B2 | * | 9/2006 | Brown et al. | 331/57 |
| 2002/0130691 | A1 | * | 9/2002 | Silvestri | 327/158 |
| 2002/0172314 | A1 | * | 11/2002 | Lin et al. | 375/376 |
| 2008/0197899 | A1 | * | 8/2008 | Gomm et al. | 327/158 |
| 2008/0246461 | A1 | * | 10/2008 | Abuhamdeh et al. | 324/76.54 |

* cited by examiner

*Primary Examiner* — Huy Q Phan
*Assistant Examiner* — Temilade S Rhodes-Vivour
(74) *Attorney, Agent, or Firm* — Winston Hsu; Scott Margo

(57) ABSTRACT

A measure initialization path for a delay line structure includes: a forward path, comprising a plurality of delay stages coupled in series; a first output path coupled to at least an output of a delay stage of the forward path, where at least an output of a delay stage is fed forward to the forward path; and a second output path coupled to at least an output of a delay stage of the forward path, where at least an output of a delay stage is fed forward to the forward path. When a signal is propagated through the measure initialization path, the signal successively propagates through a delay stage of the forward path, a delay stage of the first output path and a delay stage of the second output path for performing measure initialization.

22 Claims, 7 Drawing Sheets

US 8,901,938 B2

DELAY LINE SCHEME WITH NO EXIT TREE

BACKGROUND OF THE INVENTION

1. Field of the Invention

The present invention relates to delay lines, and more particularly, to a delay line with no exit tree that is integrated with a measure initialization path.

2. Description of the Prior Art

A standard DRAM needs to operate according to highly accurate clock timing. Internally generated clock signals are used to perform various operations of the DRAM, wherein the internal signals are generated according to an external clock, which is input to a delay line in the DRAM chip and delayed for a determined amount. In order for the DRAM to operate correctly, the internal (delayed) signals must be synchronous with the external signal; i.e. the rise and fall of both signals must match. Therefore, an amount of delay in the delay line must be precisely determined.

A standard delay line comprises a series of delay elements such as NAND gates, wherein each delay element adds a further amount of delay to the signal. For outputting the delayed signals, some delay lines include a multi-layer exit tree structure, comprising stages of further delay elements coupled to the main (forward) delay line. The addition of these multiple layers means that extra gates are added to the forward delay path, incurring larger Duty Cycle Distortion as well as larger Power Supply Sensitivity.

To solve these issues, other delay lines integrate the exit tree into the delay line, by including common entry points coupled to every NAND cell (delay element). Although this solves the problems of reducing forward path delay incurred by the above-mentioned delay line, large loading is required to power all the common entry points and introduces a new duty cycle and power supply sensitivity node issue.

By merging the exit tree with the delay line, this loading can be reduced, as well as reducing the amount of Duty Cycle Distortion and Power Supply Sensitivity. Please refer to FIG. 1, which is a diagram illustrating a delay line with no exit tree. As shown in the diagram, the delay line 100 consists of a central chain of series linked NAND pairs for receiving an 'IN' signal, an OutEven line of series linked NANDs coupled to one NAND pair chain for outputting a delayed signal, and an OutOdd line of series linked NANDs coupled to the other NAND pair chain for outputting a delayed signal. The two output signals are delayed with respect to each other but still need to be synchronized (with plus or minus static phase difference); therefore it is important that both output stages are equally matched in terms of delay.

The disadvantage of the above structure is that it is incompatible with fast measure initialization. Measure initialization is a technique used to set a delay line to a correct delay by establishing a delay amount for each stage, such that an initial starting point or final exit point can be accurately selected for each required delay. When inputting a signal to the delay line, only the last exit point is enabled such that the signal is propagated through all possible stages of the delay line. Both the input and output buffer delays can thereby be determined and the delay line can be set to have a correct initial delay for achieving fast synchronization. The system shown in FIG. 1 can only propagate a signal through one of the output buffer stages (OutOdd or OutEven). It would take a much longer time to have this delay line properly initialized (for instance, a binary search) and the delay line is therefore vulnerable to glitches which cause possible failures. As mentioned above, the signal is tapped at both 'out' stages, and if the gates are not identical the OutOdd and OutEven signals may be out of phase.

SUMMARY OF THE INVENTION

It is an objective of the present invention to provide a delay line with no exit-tree that can support measure initialization by making sure the measure initialization path is a true representation of or exactly identical to a real signal path.

A measure initialization path for determining measure initialization for a delay line structure comprises: a forward path, comprising a plurality of delay stages coupled in series, each delay stage comprising at least a pair of parallel NAND gates; a first output path coupled to at least an output of a delay stage of the forward path, comprising a plurality of delay stages, each delay stage comprising a NAND gate and corresponding to a delay stage of the forward path, where an output of at least one of the delay stages is fed forward to the forward path; and a second output path coupled to at least an output of a delay stage of the forward path, comprising a plurality of delay stages, each delay stage comprising a NAND gate and corresponding to a delay stage of the forward path, where an output of at least one of the delay stages is fed forward to the forward path. When a signal is propagated through the measure initialization path, the signal successively propagates through a delay stage of the forward path, a delay stage of the first output path and a delay stage of the second output path for performing measure initialization.

In a first embodiment, each delay stage of the forward path apart from the first delay stage further comprises a multiplexer, for receiving the input signal as an output from a previous delay stage of one of the first output path and the second output path and selectively propagating the input signal through one of the parallel NAND gates of a corresponding delay stage of the forward path according to a first control signal. When a multiplexer of one of the delay stages receives a second control signal, the input signal will be propagated through the other of the parallel NAND gates of the corresponding delay stage.

In a second embodiment, a dedicated measurement path is parallel to a real signal path; each delay stage of the first output path corresponds to every other delay stage of the forward path, and each delay stage of the second output path corresponds to every other delay stage of the forward path such that when the input signal is successively propagated through a delay stage of the forward path, a delay stage of the first output path and a delay stage of the second output path, the input signal will be propagated through all delay stages of the first output path and the second output path.

In a third embodiment, every delay stage of the forward path apart from the first delay stage further comprises a three-input NAND gate coupled in parallel with the pair of parallel NAND gates, and each three-input NAND gate is for receiving the input signal as an output from a previous delay stage of one of the first output path and the second output path. Each three-input NAND gate receives the input signal as an output according to a measure initialization enable signal, and when each three-input NAND gate does not receive the measure initialization enable signal, the input signal will be propagated through one of the pair of corresponding parallel NAND gates. Each pair of parallel NAND gates of the forward path receives a delay logic signal and an exit enable signal, and the input signal is selectively propagated through one of each pair of parallel NAND gates according to the corresponding delay logic signal and exit enable signal. The measure initialization path further comprises a shift register and control logic circuit for providing the measure initialization enable signals, the exit enable signals and the delay logic signals.

A method for performing measure initialization for a delay line structure comprises: providing a forward path, comprising a plurality of delay stages coupled in series, each delay stage comprising at least a pair of parallel NAND gates; providing a first output path coupled to at least an output of a delay stage of the forward path, the first output path comprising a plurality of delay stages, each delay stage comprising a NAND gate and corresponding to a delay stage of the forward path; a second output path coupled to at least an output of a delay stage of the forward path, comprising a plurality of delay stages, each delay stage comprising a NAND gate and corresponding to a delay stage of the forward path; inputting an input signal to the forward path; propagating the input signal to one of the first output path and the second output path; and feeding an output of the first output path or the second output path forward to the forward path to thereby successively propagate the input signal through a delay stage of the forward path, a delay stage of the first output path and a delay stage of the second output path for performing measure initialization.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a number of embodiments that delay a signal through a delay line that can incorporate measure initialization, while removing the need for multiple layers of exit-trees. This technique can save power while retaining accuracy, and also enables fast signal synchronization.

Figure 1:
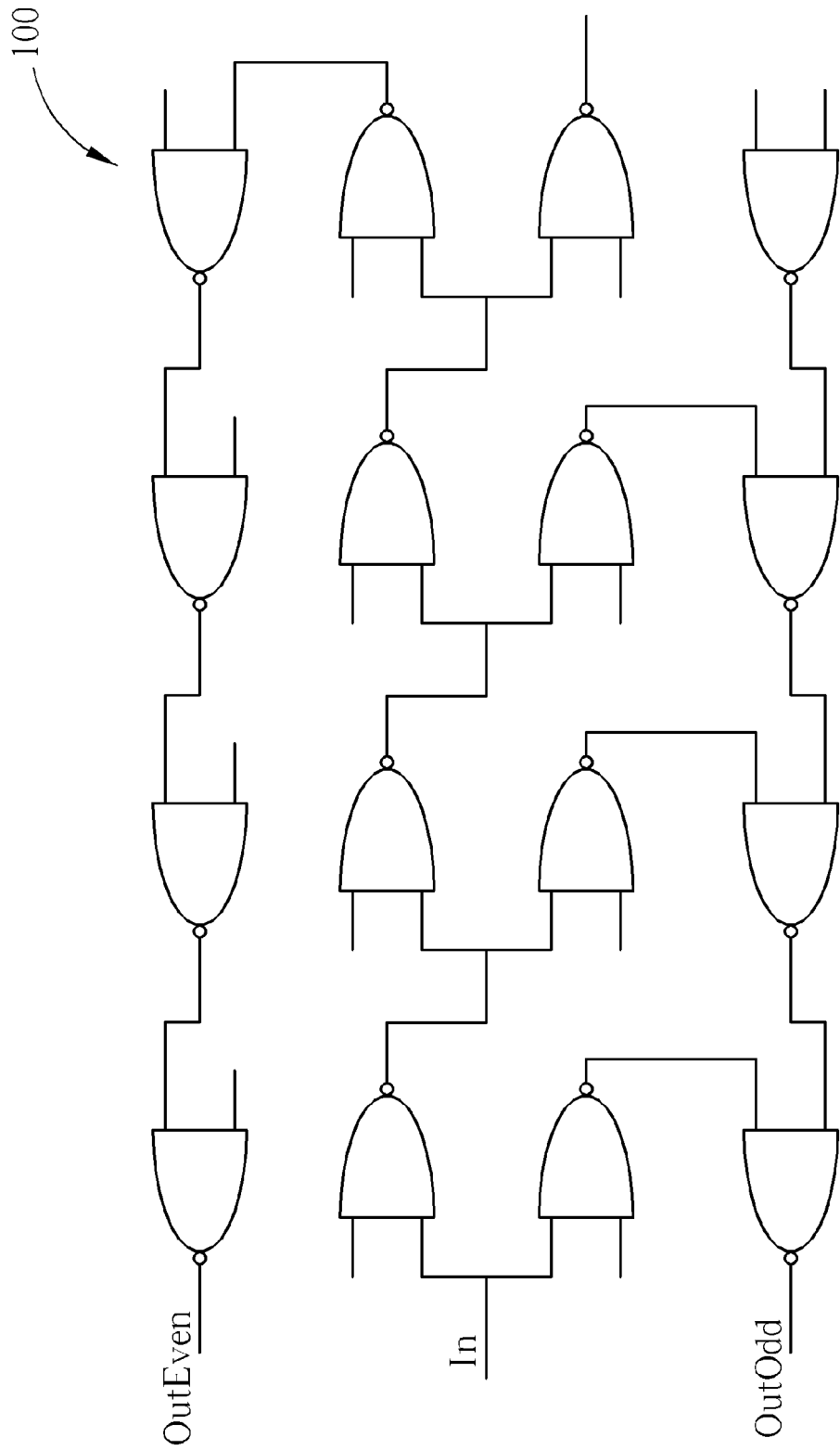
FIG. 1 is a diagram of a conventional delay line with no exit tree.
Figure 2:
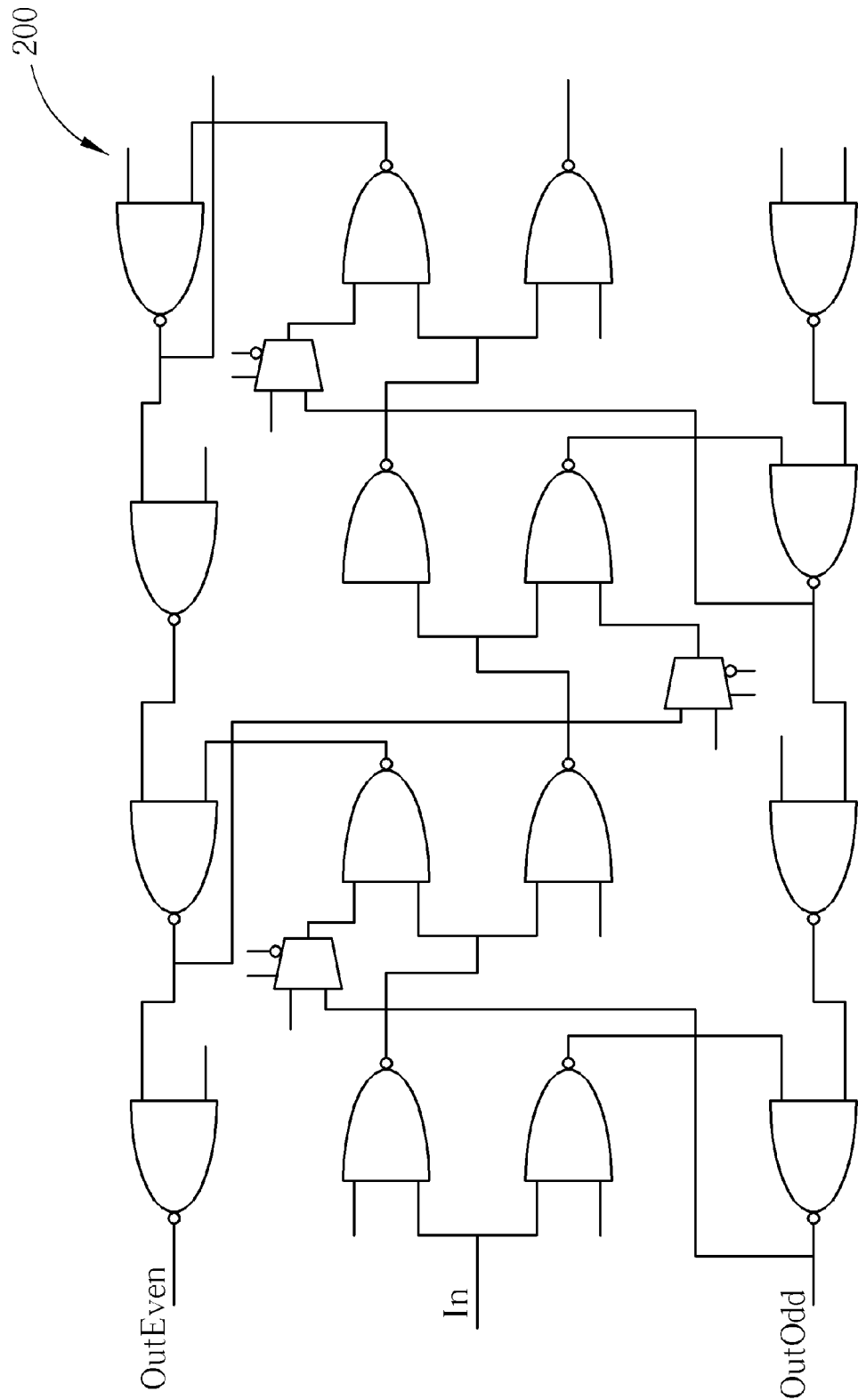
FIG. 2 is a diagram of a delay line with no exit tree integrated with a measure initialization path according to a first embodiment of the present invention.

Please refer to FIG. 2, which provides a delay line structure according to a first exemplary embodiment of the present invention. As shown in FIG. 2, the architecture is quite similar to that in FIG. 1 except that the delay line 200 also comprises a number of multiplexers along the main (forward) delay line. These multiplexers are controlled by signal logic which enables an input signal to be propagated along the entire signal path for measure initialization according to a first control signal or enables the input signal to exit the delay line structure (via OutOdd or OutEven paths) according to a second control signal. For example, if a signal is input to the IN delay line, and propagated through the first bottom 'IN' NAND and the first OutOdd NAND, when the first control signal is input to the first multiplexer, the signal will pass through the multiplexer and continue along the forward path rather than being output on the OutOdd line. If, however, the second control signal is input to the first multiplexer, the signal will be directly output on the OutOdd line. In this way, the integrated delay line can be used for both normal delaying of input signals and for measure initialization. During this measure initialization, all exit points are enabled for measurement but the signal is also fed forward via the multiplexer.

Figure 3:
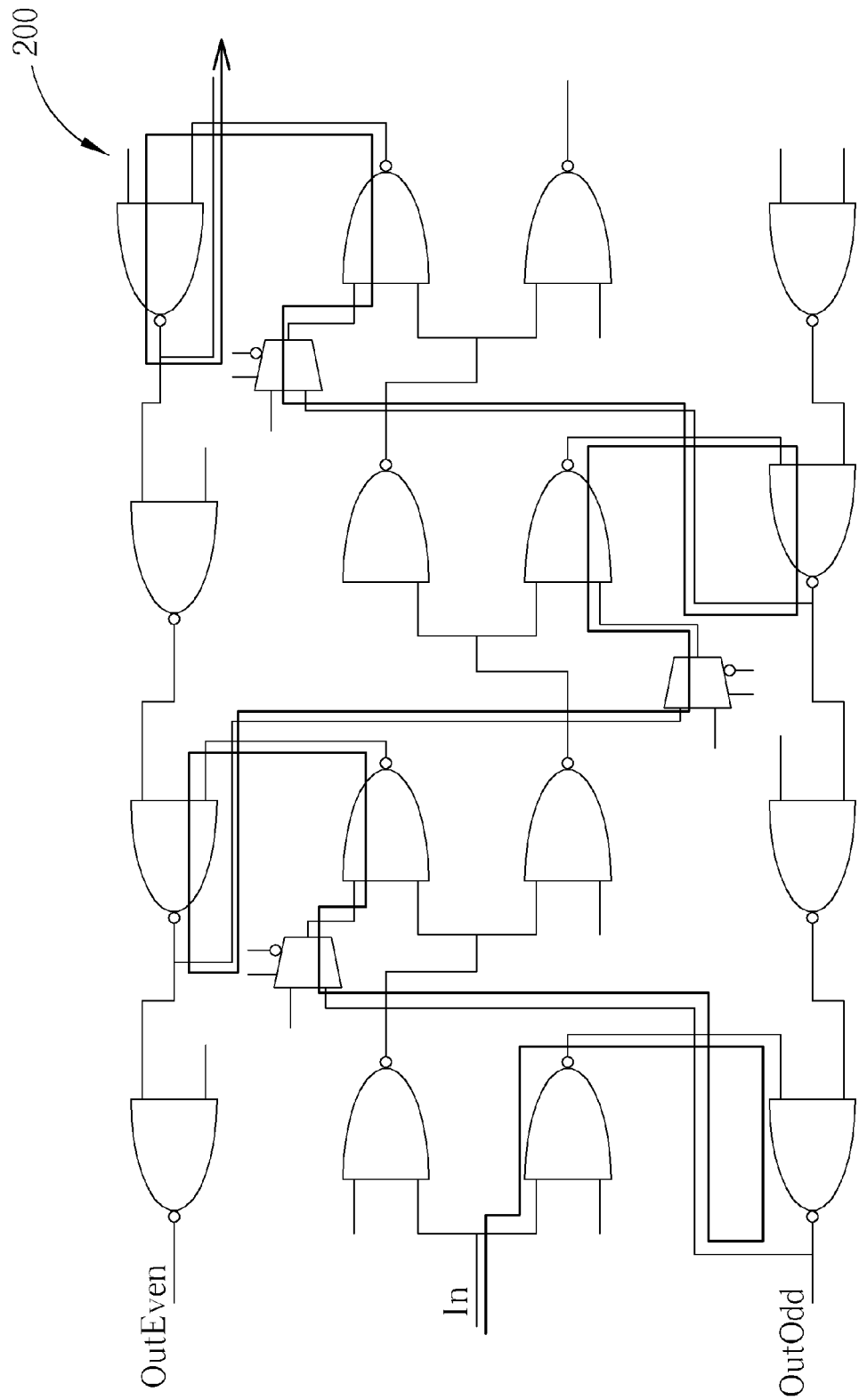
FIG. 3 is a diagram of a signal being propagated through the delay line shown in FIG. 2 for performing measure initialization.

Please see FIG. 3, which shows a signal being propagated along the entire delay line for measure initialization. In this diagram, it is to be understood that each multiplexer receives a first control signal, so all the multiplexers have an output which is the signal. This technique can accurately determine the amount of delay in both the forward path as well as both output paths. For example, if an OutEven signal is to be delayed for two stages (two NANDs in the forward path and two NANDs in the output path) and the OutOdd signal is to be delayed for one stage (one NAND in the forward path and one NAND in the output path) then the measure initialization path can completely determine the delay for the OutOdd path and determines three out of the four NANDs for the OutEven path. This scheme ensures the accuracy of measure Initialization is within one stage.

Another embodiment creates a separate measure initialization signal path utilizing the same gates (delay stages) which will be used in a delay line for normal delay operations. Please refer to FIG. 4, which is a diagram of a measure initialization path 300 according to a second embodiment of the present invention. As shown in the diagram and compared with FIG. 2, it can be seen that the circuit 300 is very similar to the circuit 200 except that there are no multiplexers and no output paths. Instead, a return signal of a previous stage is directly propagated to the forward path. The NANDs in each output path that do not form part of the measure initialization path as illustrated in FIG. 3 are removed. At what would be each exit point, the delay is tapped and measured. The tap points and signal path are illustrated in FIG. 5. As shown in the diagram, Out M<1> determines the delay for a first delay stage, Out M<2> determines the delay for two delay stages, etc.

This embodiment requires a separate delay line for generating the internally delayed signals. The delay line can have the same architecture as that shown in FIG. 1. If the same signal gates are used in the delay line 100 and the measure initialization path 300 then the delay determined in the measure initialization stage 300 will be the same as that generated by the delay line 100. For example, when a signal on the OutEven line is to be delayed for two delay stages, the delay should match that tapped at Out M<2>. In the measure initialization path, this is determined by the signal being propagated through four NANDs. If the same NANDs in circuit 300 are utilized to construct the delay line 100, and a same NAND used at the tap point Out M<1> is used as the first output NAND in the OutEven line, then the delay determined in the measure initialization path should be identical to that incurred by a signal being delayed for two delay stages. This embodiment saves on loading required for the multiplexers in circuit 200 but requires more area, as a separate measure initialization path and delay line are both needed. This scheme performs better in terms of higher speed clock frequency and higher accuracy compared to the concept in the first embodiment.

Figure 4:
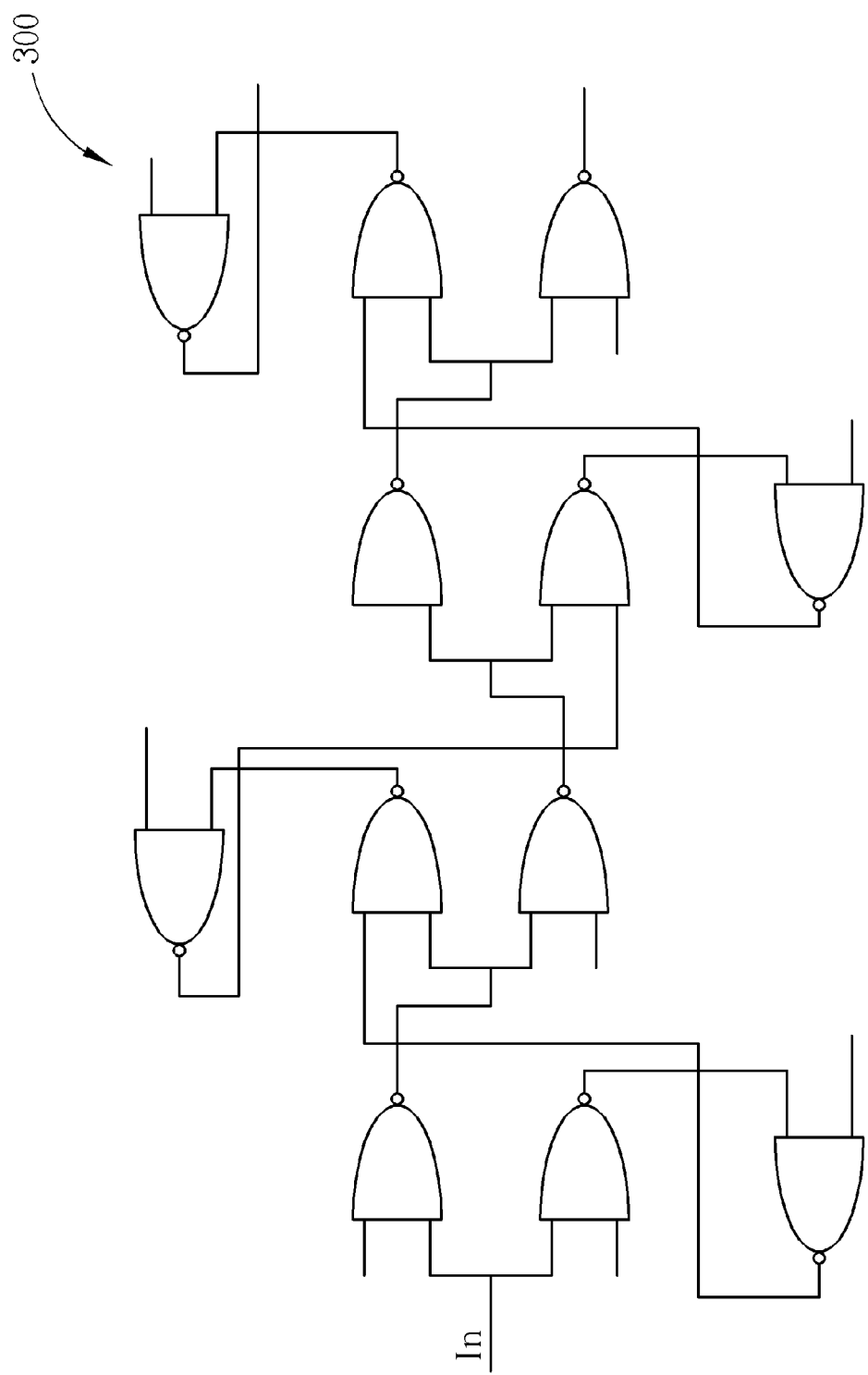
FIG. 4 is a diagram of a measure initialization path according to a second embodiment of the present invention.
Figure 5:
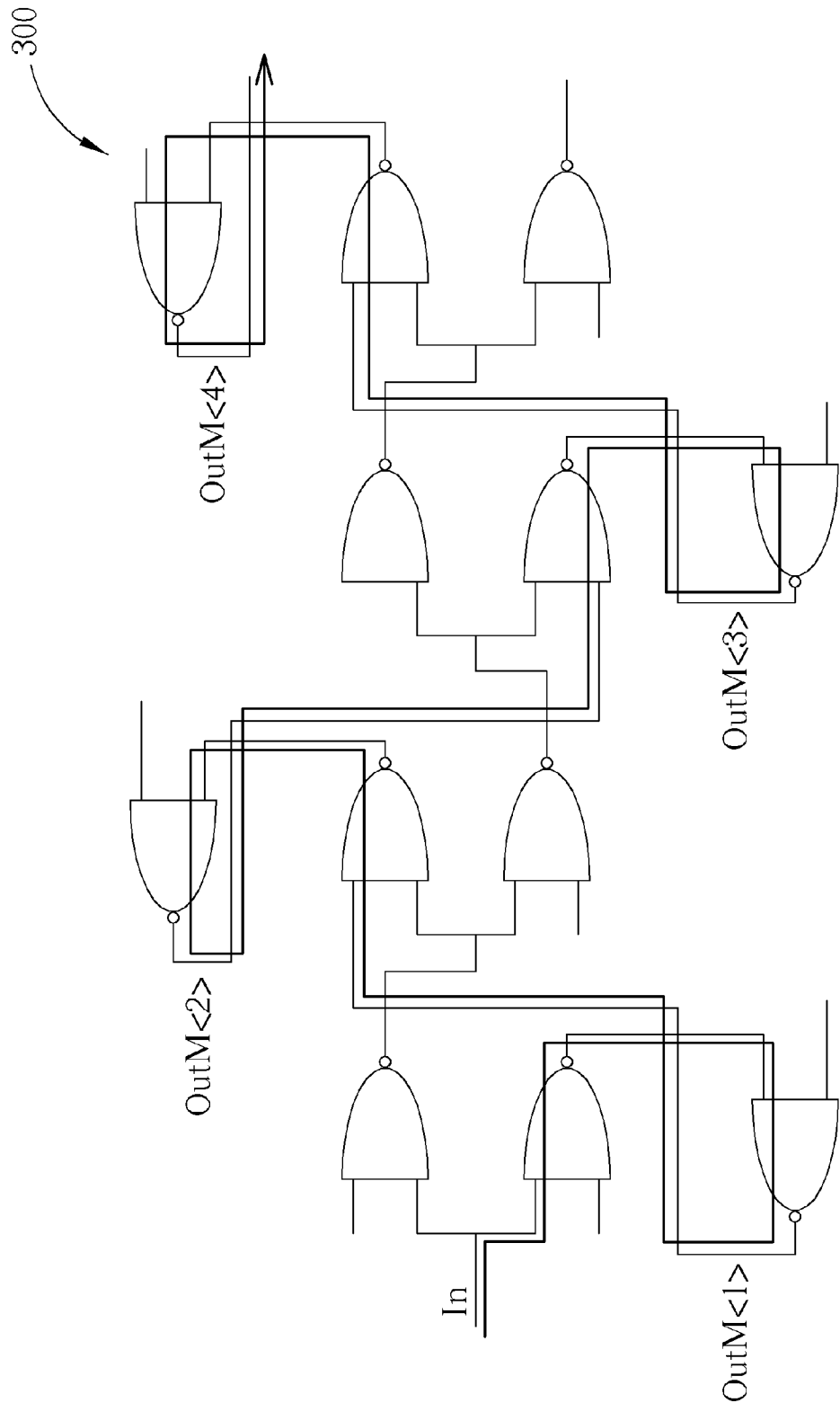
FIG. 5 is a diagram of a signal being propagated through the measure initialization path shown in FIG. 3.

Both the embodiments shown in FIG. 2 and FIG. 4 can perform measure initialization using both inside and outside NANDs of a delay line such that the delay of an actual coarse unit can be accurately determined and initialized.

A further embodiment integrates a measure initialization path with a delay line as in the first embodiment shown in FIG. 2. Rather than utilizing multiplexers, however, this embodiment utilizes parallel NAND gates controlled by enable signals for propagating the signal and controlling between measure initialization and normal delay line operation. This method has the advantage of not adding any extra delay to the propagated signal (the multiplexers in circuit 200 will have some incurred delay).

Figure 6:
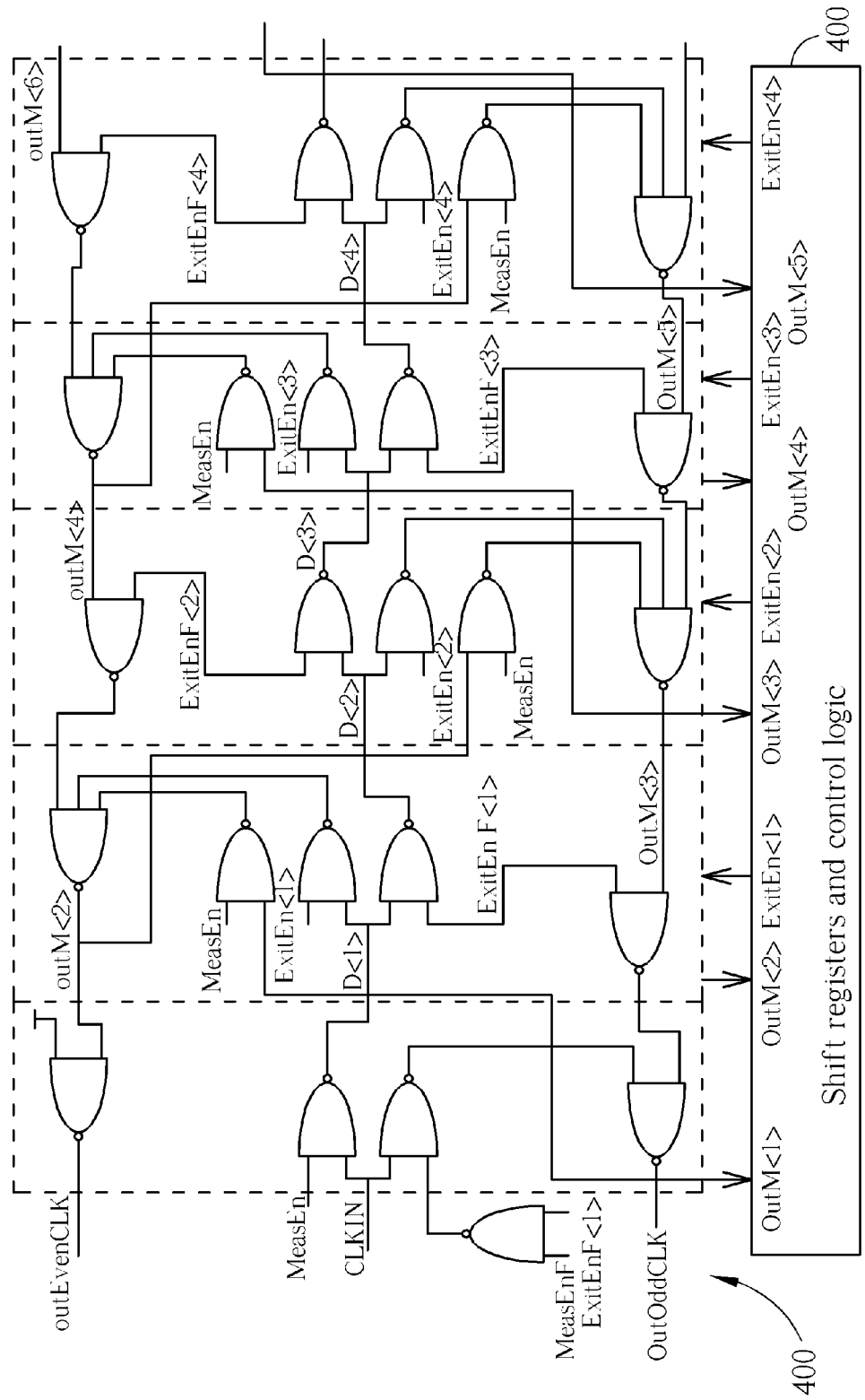
FIG. 6 is a diagram of a delay line with no exit tree integrated with a measure initialization path according to a third embodiment of the present invention.

Please refer to FIG. 6, which illustrates a delay line 400 with an integrated measure initialization path. The delay line 400 is coupled to a shift register and control logic circuit 410 for enabling the control logic. As illustrated in the diagram, the utilization of an extra NAND gate in the forward path for propagating the signal during normal delay line operations means that two NANDs in the respective output lines will require three inputs rather than two. As in the second embodiment, the outputs are tapped during measure initialization in order to obtain the delay results. These tapped delays are passed to the shift register and control logic 410. An inverse measure enable signal MeasEnF is input to the top first NAND of the forward path, and also to an additional NAND coupled to the bottom first NAND of the forward path. This additional NAND has a second input which is ExitEnF<1>. Measure initialization enable signals MeasEn are further input to each NAND in the forward path which is coupled to a return signal of a previous delay stage. In addition, exit enable signals ExitEn<n> are input to each middle NAND in the forward path, and delay signals D<n> indicating how many delay stages a signal needs to go through are input to the forward path.

Figure 7:
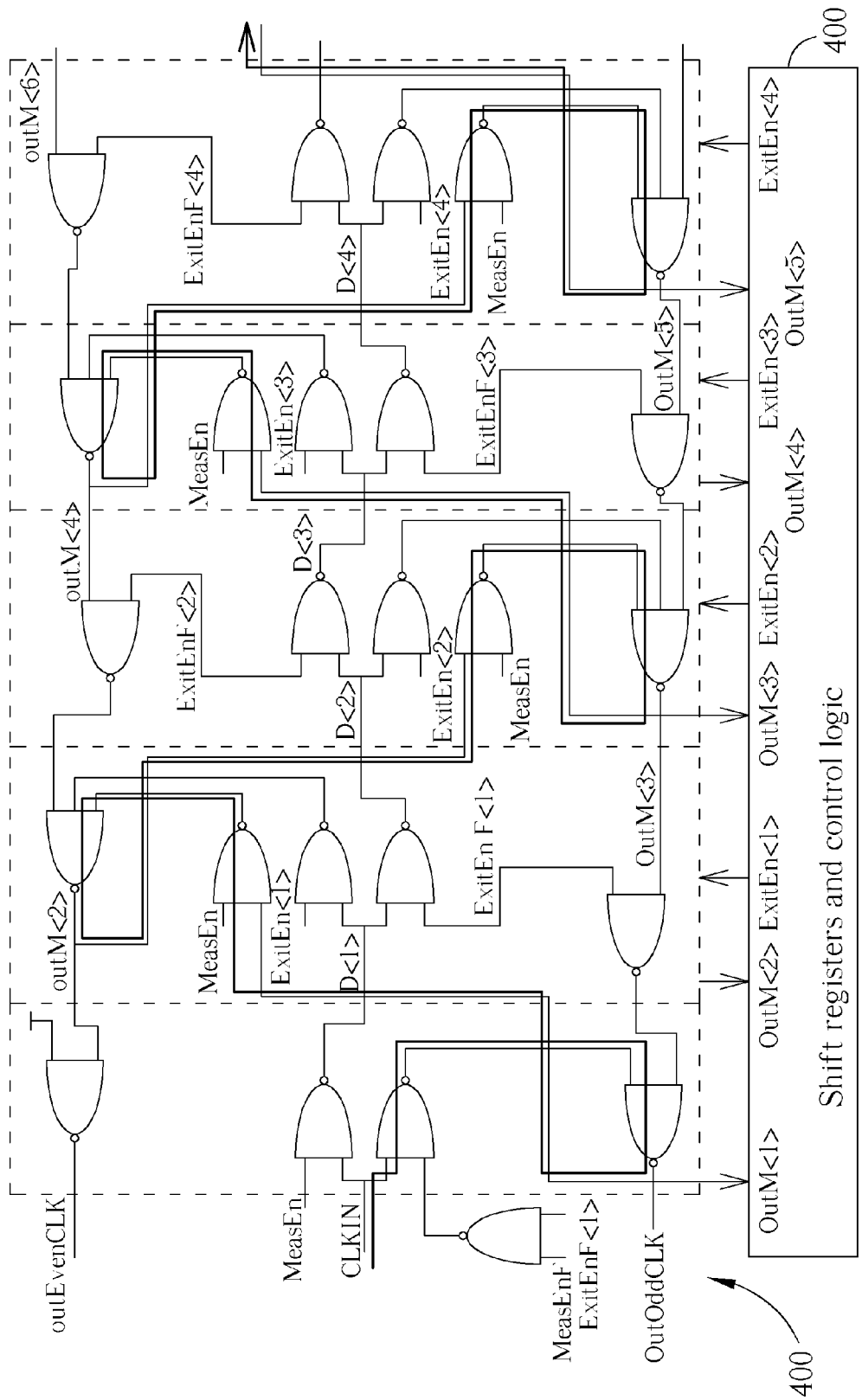
FIG. 7 is a diagram of a signal being propagated through the delay line shown in FIG. 6 for performing measure initialization.

FIG. 7 shows a signal being propagated through the entire delay line for measure initialization. The use of the logic signals controlled by the shift register and control logic circuit 410 enables some NANDs to be open and others to be closed, such that the signal can go through all possible delay stages. As mentioned before, the signal is also tapped at various exit points, as indicated by the OutM<n> inputs to the shift register and control logic 410. This enables the exact amount of delay for each stage to be known. When the delay line is in operation, the delay signal will be propagated through different NANDs in the forward path, but the use of the parallel NAND design ensures that the delay will be the same as during measure initialization.

After reading the above description and referring to the logic signals provided in FIG. 6 and FIG. 7, it should be obvious to one skilled in the art how the signal is propagated through the delay line for normal delay operations; therefore, the operation is not detailed here.

In summary, the invention provides various delay line structures that are integrated with a measure initialization path and do not require an exit tree. The measure initialization is able to be determined for both the inside and outside NANDs in the delay line, ensuring greater accuracy. Furthermore, the problem of excess loading required by the traditional multi-layer exit tree structure is removed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A measure initialization path for determining measure initialization for a delay line structure, the measure initialization path comprising:
a forward path, comprising a plurality of delay stages coupled in series, each delay stage comprising at least a pair of parallel NAND gates;
a first output path coupled to at least an output of a delay stage of the forward path, the first output path comprising a plurality of delay stages, wherein each delay stage of the first output path comprises a NAND gate and is coupled to a NAND gate of a corresponding delay stage of the forward path, where an output of at least one of the delay stages of the first output path is fed forward to the forward path; and
a second output path coupled to at least an output of a delay stage of the forward path, the second output path comprising a plurality of delay stages, wherein each delay stage of the second output path comprises a NAND gate and is coupled to a NAND gate of a corresponding delay stage of the forward path, where an output of at least one of the delay stages is fed forward to the forward path;
wherein when an input signal is propagated through the measure initialization path, the input signal successively propagates through a delay stage of the forward path, a delay stage of the first output path corresponding to the delay stage of the forward path, a next delay stage of the forward path and a delay stage of the second output path corresponding to the next delay stage of the forward path until the input signal is output by one of the first output path or the second output path for performing measure initialization.

2. The measure initialization path of claim 1, wherein each delay stage of the forward path apart from the first delay stage further comprises a multiplexer, for receiving the input signal as an output from a previous corresponding delay stage of one of the first output path and the second output path and selectively propagating the input signal through one of the parallel NAND gates of a corresponding delay stage of the forward path according to a first control signal.

3. The measure initialization path of claim 2, wherein when a multiplexer of one of the delay stages of the forward path receives a second control signal, the input signal will be propagated through the other of the parallel NAND gates of the corresponding delay stage.

4. The measure initialization path of claim 1, wherein a delay of the input signal for each delay stage is determined according to an output of the first output path and an output of the second output path.

5. The measure initialization path of claim 1, wherein each delay stage of the first output path corresponds to every other delay stage of the forward path, and each delay stage of the second output path corresponds to every other delay stage of the forward path such that when the input signal is successively propagated through a delay stage of the forward path, a delay stage of the first output path corresponding to the delay stage of the forward path, a next delay stage of the forward path and a delay stage of the second output path corresponding to the next delay stage of the forward path, the input signal will be propagated through all delay stages of the first output path and the second output path.

6. The measure initialization path of claim 5, wherein a delay of the input signal for each delay stage of the forward path is determined by tapping each delay stage of the first output path and each delay stage of the second output path.

7. The measure initialization path of claim 1, wherein every delay stage of the forward path apart from the first delay stage further comprises a third NAND gate coupled in parallel with the pair of parallel NAND gates, and each third NAND gate is for receiving the input signal as an output from a previous corresponding delay stage of one of the first output path and the second output path.

8. The measure initialization path of claim 7, wherein each third NAND gate receives the input signal as an output according to a measure initialization enable signal, and when each third NAND gate does not receive the measure initialization enable signal, the input signal will be propagated through one of the pair of corresponding parallel NAND gates.

9. The measure initialization path of claim 8, wherein each pair of parallel NAND gates of the forward path receives a delay logic signal and an exit enable signal, and the input signal is selectively propagated through one of each pair of parallel NAND gates according to the corresponding delay logic signal and exit enable signal.

10. The measure initialization path of claim 9, further comprising:
a shift register and control logic circuit, coupled to the forward path, the first output path and the second output path, for providing the measure initialization enable signals, the delay logic signals and the exit enable signals.

11. The measure initialization path of claim 10, wherein a delay of the input signal for each delay stage is determined according to an output of the first output path and an output of the second output path which is received by the shift register and control logic circuit.

12. A method for performing measure initialization for a delay line structure, the method comprising:
providing a forward path, comprising a plurality of delay stages coupled in series, each delay stage comprising at least a pair of parallel NAND gates;
providing a first output path coupled to at least an output of a delay stage of the forward path, the first output path comprising a plurality of delay stages, each delay stage of the first output path comprising a NAND gate which is coupled to a NAND gate of a corresponding delay stage of the forward path;
a second output path coupled to at least an output of a delay stage of the forward path, the second output path comprising a plurality of delay stages, each delay stage of the second output path comprising a NAND gate which is coupled to a NAND gate of a corresponding delay stage of the forward path;
inputting an input signal to the forward path;
propagating the input signal to one of the first output path and the second output path; and
feeding an output of the first output path or the second output path forward to the forward path to thereby successively propagate the input signal through a delay stage of the forward path, a delay stage of the first output path corresponding to the delay stage of the forward path, a next delay stage of the forward path and a delay stage of the second output path corresponding to the next delay stage of the forward path until the input signal is output by one of the first output path or the second output path for performing measure initialization.

13. The method of claim 12, further comprising:
providing each delay stage of the forward path apart from the first delay stage with a multiplexer; and
the step of feeding an output of the first output path or the second output path forward to the forward path to thereby successively propagate the input signal through a delay stage of the forward path, a delay stage of the first output path and a delay stage of the second output path for performing measure initialization comprises:

inputting a first control signal to each multiplexer; and
utilizing each multiplexer to receive the input signal as an output from a previous corresponding delay stage of one of the first output path and the second output path and selectively propagating the input signal through one of the parallel NAND gates of a corresponding delay stage of the forward path.

14. The method of claim 13, further comprising:
inputting a second control signal to each multiplexer of one of the delay stages of the forward path;
utilizing each multiplexer for propagating the input signal through the other of the parallel NAND gates of the corresponding delay stage.

15. The method of claim 12, wherein a delay of the input signal for each delay stage is determined according to an output of the first output path and an output of the second output path.

16. The method of claim 12, wherein each delay stage of the first output path corresponds to every other delay stage of the forward path, and each delay stage of the second output path corresponds to every other delay stage of the forward path such that when the input signal is successively propagated through a delay stage of the forward path, a delay stage of the first output path corresponding to the delay stage of the forward path, a next delay stage of the forward path and a delay stage of the second output path corresponding to the next delay stage of the forward path, the input signal will be propagated through all delay stages of the first output path and the second output path.

17. The method of claim 16, wherein a delay of the input signal for each delay stage of the forward path is determined by tapping each delay stage of the first output path and each delay stage of the second output path.

18. The method of claim 12, further comprising:
providing every delay stage of the forward path apart from the first delay stage with a third NAND gate coupled in parallel with the pair of parallel NAND gates;
and the step of feeding an output of the first output path or the second output path forward to the forward path to thereby successively propagate the input signal through a delay stage of the forward path, a delay stage of the first output path and a delay stage of the second output path for performing measure initialization comprises:
utilizing each third NAND gate for receiving the input signal as an output from a previous corresponding delay stage of one of the first output path and the second output path.

19. The method of claim 18, wherein the step of utilizing each third NAND gate for receiving the input signal as an output from a previous delay stage of one of the first output path and the second output path comprises:
generating a measure initialization enable signal; and
utilizing each third NAND gate to receive the input signal as an output according to the measure initialization enable signal;
and the method further comprises:
when each third NAND gate does not receive the measure initialization enable signal, propagating the input signal through one of the pair of corresponding parallel NAND gates.

20. The method of claim 19, wherein the step of inputting an input signal to the forward path comprises:
generating a delay logic signal and an exit enable signal to each pair of parallel NAND gates of the forward path; and selectively propagating the input signal through one of each pair of parallel NAND gates according to the corresponding delay logic signal and exit enable signal.

21. The method of claim 20, further comprising:
providing a shift register and control logic circuit, coupled to the forward path, the first output path and the second output path, for providing the measure initialization enable signals, the delay logic signals and the exit enable signals.

22. The method of claim 21, wherein a delay of the input signal for each delay stage is determined according to an output of the first output path and an output of the second output path which is received by the shift register and control logic circuit.

* * * * *